United States Patent
Hasan et al.

(10) Patent No.: US 8,288,983 B2
(45) Date of Patent: Oct. 16, 2012

(54) OPTICAL TELEMETRY SYSTEM AND METHOD FOR ELECTRO-MECHANICAL SWITCHES

(75) Inventors: Mohamed A. Hasan, Yardley, PA (US); Luke D. Titus, Newtown, PA (US); Les McLaughlin, Glenside, PA (US)

(73) Assignee: Lockheed Martin Corporation, Bethesda, MD (US)

(*) Notice: Subject to any disclaimer, the term of this patent is extended or adjusted under 35 U.S.C. 154(b) by 798 days.

(21) Appl. No.: 12/482,390

(22) Filed: Jun. 10, 2009

(65) Prior Publication Data

US 2010/0007520 A1  Jan. 14, 2010

Related U.S. Application Data

(60) Provisional application No. 61/079,700, filed on Jul. 10, 2008.

(51) Int. Cl.
*B25J 9/18* (2006.01)
(52) U.S. Cl. .................................. 318/568.11; 318/480
(58) Field of Classification Search ............ 318/568.11, 318/480; 340/870.01; 345/161
See application file for complete search history.

(56) References Cited

U.S. PATENT DOCUMENTS

| | | | |
|---|---|---|---|
| 4,712,000 A | 12/1987 | Yoshikawa et al. | |
| 4,912,382 A | 3/1990 | Koenig et al. | |
| 4,965,542 A | 10/1990 | Nelson | |
| 5,285,058 A | 2/1994 | Goodwin | |
| 6,147,856 A | 11/2000 | Karidis | |
| 2004/0135077 A1 | 7/2004 | Hane | |
| 2005/0195168 A1* | 9/2005 | Rosenberg et al. | 345/161 |
| 2007/0246646 A1 | 10/2007 | Lum et al. | |
| 2008/0042051 A1 | 2/2008 | Sidor et al. | |
| 2009/0015073 A1 | 1/2009 | Lloyd | |

* cited by examiner

*Primary Examiner* — Karen Masih
(74) *Attorney, Agent, or Firm* — McDermott Will & Emery LLP (57) ABSTRACT

A system or method of verifying a new contact position of a multi-pole electro-mechanical switch having a plurality of contact positions is disclosed. The switch is caused to move to a new contact position. Power is provided to at least one light transmitter to cause the at least one light transmitter to transmit light toward a light reflective portion. A particular light detector among a plurality of light detectors that has received light from the light reflective portion is identified. The new contact position is verified based on the identification.

19 Claims, 6 Drawing Sheets

OPTICAL TELEMETRY SYSTEM AND METHOD FOR ELECTRO-MECHANICAL SWITCHES

CROSS-REFERENCES TO RELATED APPLICATIONS

The present application claims the benefit of U.S. Provisional Patent Application Ser. No. 61/079,700, entitled "OPTICAL TELEMETRY SYSTEM FOR ELECTRO-MECHANICAL SWITCHES," filed on Jul. 10, 2008, which is hereby incorporated by reference in its entirety for all purposes.

STATEMENT REGARDING FEDERALLY SPONSORED RESEARCH OR DEVELOPMENT

Not applicable.

BACKGROUND

1. Field

The subject technology relates generally to electromechanical switches, and more specifically to system and method of optical telemetry for electromechanical switches.

2. Background

Many telecommunications systems employ electromechanical switches to pass radio frequency (RF) signals. One application for these types of electromechanical switches is in spacecraft communications wherein an uplink RF signal may be transmitted as a downlink RF signal. These types of telecommunications systems frequently make use of a multi-pole electro-mechanical switch (e.g., a rotary switch) in which a signal provided to a motor, positioned within or without the switch, causes the switch to change its position or state.

In many of these RF switch applications, the electromechanical RF switches are remotely located, such as in an isolated telecommunications switching center or in a spacecraft. Because of the remoteness and inaccessibility of the RF switches, it is important to provide a telemetry system to monitor the status or position of each of the RF switches. In some cases, a sensor portion of the telemetry system is integrated in the same package as the RF switch being monitored to form an integrated electromechanical switch.

In conventional electromechanical switches, the sensor portion includes a number of electromechanical sensor switches where one of the sensor switches is actuated at a given position of the multi-pole electromechanical switch. For example, the sensor portion can include a combination of a magnet and magnetically actuated reed switches (the number of reed switches being equal to the number of poles of the electromechanical switch) in which as the position of the electromechanical switch is changed from a first position to a second position, the magnet moves from a first location above a first reed switch associated with the first position to a second location above a second reed switch associated with the second position. The movement of the magnet causes release (e.g., opening) of the first reed switch and actuation (e.g., closing) of the second reed switch. By monitoring the states of all the reed switches and determining which one of the switches is actuated (e.g., by monitoring their outputs), the telemetry system can determine or verify the position of the multi-pole electromechanical switch.

However, such electromechanical switch telemetry based on electromechanical sensor switches such as reed switches can fail to provide accurate indication of the RF switch position due to a failure of one of the sensor switches. The failure of the sensor switch is often attributable to electromechanical nature of the switch including foreign object debris in the plating of the contact surfaces of the switch.

SUMMARY

According to various aspects of the present disclosure, an optical telemetry system for monitoring the position of an electromechanical switch is provided. In such an optical telemetry system, optical sensors can be provided inside the electromechanical switch.

In one aspect of the disclosure, an electromechanical switch is disclosed. The electro-mechanical switch comprises a switching member having a common contact and a plurality of switch contacts. The common contact is configured to be connected to one of the plurality of switch contacts in a given switch position. The electromechanical switch further comprises a motor coupled to the switching member and configured to rotate by a predetermined angle in response to a rotation signal. The electromechanical switch further comprises a target disk coupled to the motor and configured to be rotated by the predetermined angle. Part of the surface of the target disk has a light reflective portion. The electromechanical switch further comprises at least one light transmitter disposed relative to the target disk and configured to transmit light toward the surface of the target disk having the light reflective portion. The electromechanical switch further comprises a plurality of light detectors disposed relative to the at least one light transmitter. Each of the plurality of light detectors is associated with a corresponding one of the plurality of switch contacts. At least one of the plurality of light detectors is configured to receive light reflected from the light reflective portion of the target disk for a given switch position.

In one aspect of the disclosure, a method of verifying a new contact position of a multi-pole electro-mechanical switch having a plurality of contact positions is disclosed. The method comprises causing the switch to move to a new contact position. The method further comprises providing power to at least one light transmitter to cause the at least one light transmitter to transmit light toward a light reflector. The method further comprises identifying a particular light detector among a plurality of light detectors that has received light reflected from the light reflector. The method further comprises verifying the new contact position based on the identification.

In one aspect of the disclosure, a telemetry system is disclosed. The telemetry system comprises an electromechanical switch. The electromechanical switch comprises a switching member having a plurality of contact positions. The electromechanical switch further comprises a motor coupled to the switching member. The electromechanical switch further comprises a target disk coupled to the motor and having a light reflective portion. The electromechanical switch further comprises at least one light transmitter disposed relative to the target disk and configured to transmit light toward the target disk. The electromechanical switch further comprises a plurality of light detectors disposed relative to the light detector. At least one of the plurality of light detectors is configured to receive light reflected from the light reflective portion for a given switch position. The telemetry system further comprises a control system electrically coupled to the electromechanical switch. The control system is configured to send a rotation signal to the motor to cause the switching member to move to a new contact position. The control system is further configured to provide power to the at least one light transmitter to cause the at least one light transmitter to transmit light toward a light reflector. The control system is further configured to identify a particular light detector among the plurality of light detectors that has received light reflected from the light reflector. The control system is further configured to verify the new contact position based on the identification.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Figure 1:
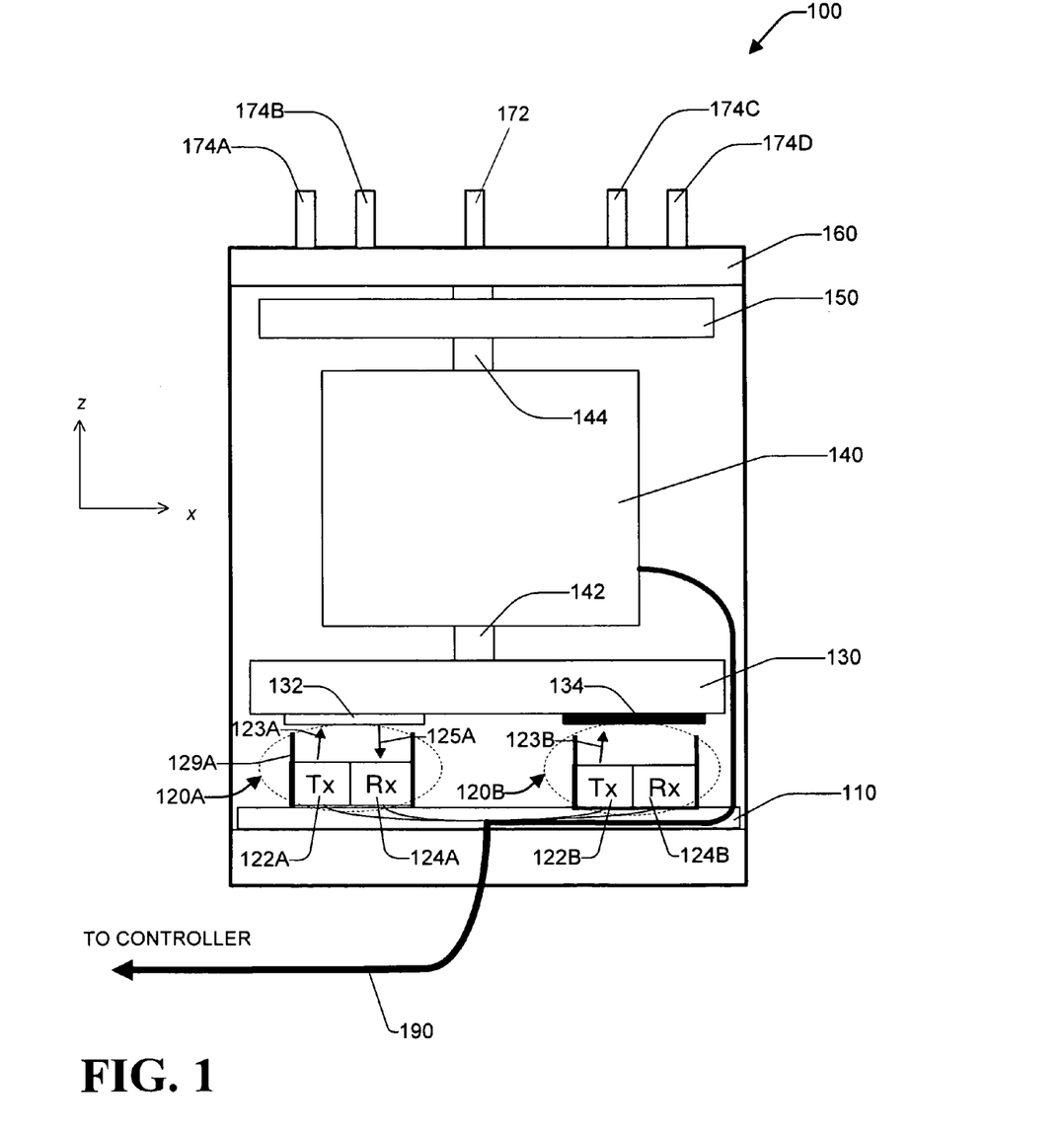
FIG. 1 is a diagram illustrating an exemplary electromechanical switch with optical telemetry according to a certain aspect of the present disclosure.
Figure 2:
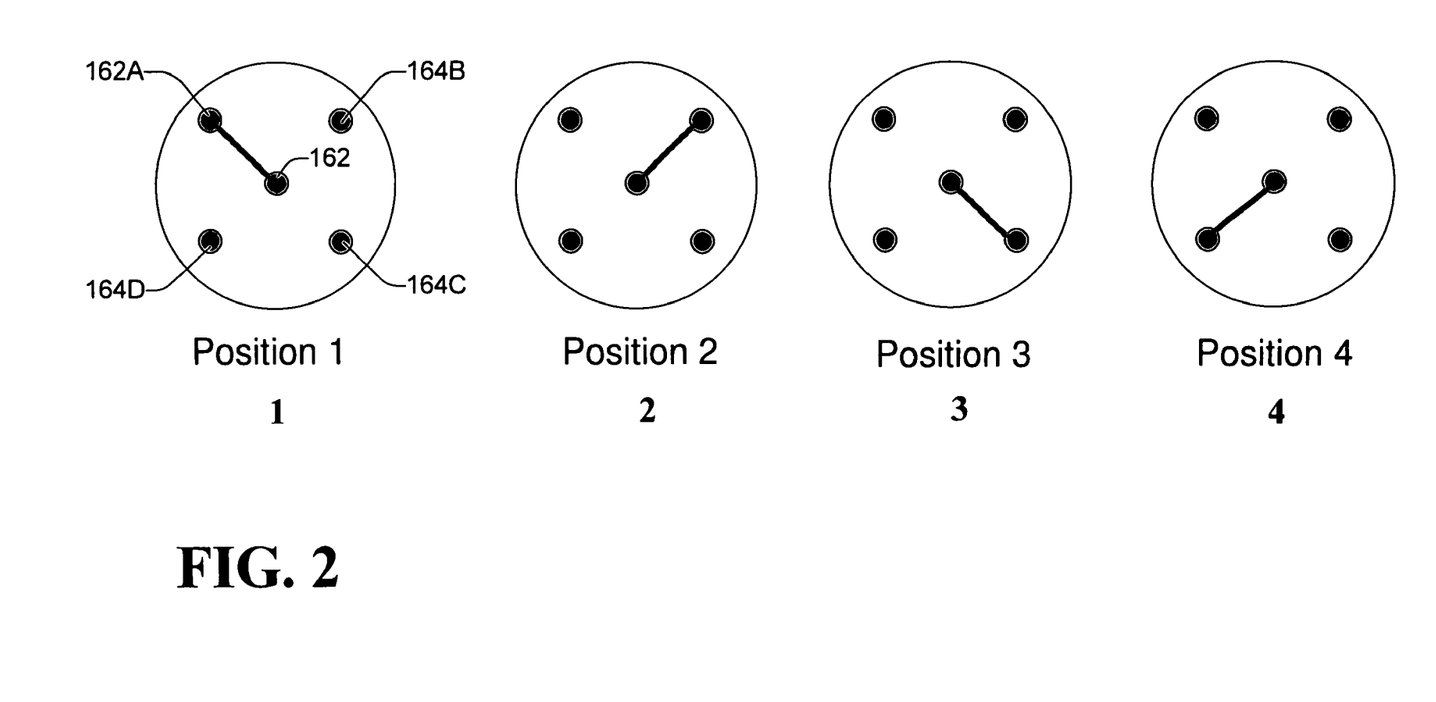
FIG. 2 is a diagram illustrating various positions of an SP4T exemplary electro-mechanical switch of FIG. 1.

FIG. 1 is a diagram illustrating an exemplary multi-pole electromechanical switch 100 according to a certain aspect of the present disclosure. FIG. 2 is a diagram illustrating various positions of the electromechanical switch 100. In the illustrated example of FIGS. 1 and 2, the electromechanical switch 100 is assumed to be a single-pole 4-throw (SP4T) switch having one common contact and 4 switch contacts. However, it will be appreciated by a person skilled in the art that various aspects of the present disclosure are applicable to other switch configurations such as single-pole multi-throw switches (e.g., SPDT or SP8T) and multi-pole multi-throw switches (e.g., DPDT or DP4T).

The electro-mechanical switch 100 includes RF connectors 172, 174A-D, a switching member 160 comprising a plurality of contacts, an actuator 150, a motor 140 having an upper rotor 144 and a lower rotor 142, a target disk 130 having a reflective portion 132 and non-reflective portions 134 (only 1 out of 3 shown for simplicity), and a printed circuit board (PCB) 110 on which optical sensors 120A, 120B (only 2 out of 4 shown for simplicity) are provided. The electromechanical switch 100 is connected to a control system 601 (FIG. 6) via a control cable 190.

The connectors 172, 174A-D are internally connected to various contacts inside the switching member 160. For example, as FIG. 2 illustrates, the switching member 160 includes a common contact 162, and 4 switch contacts 164A-D that are internally connected to the connectors 172, 174A-D inside the switching member 160. The motor 140 is configured to receive a rotation signal 192 from the control system 601 (FIG. 6) via the control cable 190 and rotate the actuator 150 and the target disk 130 via the upper rotor 144 and the lower rotor 142, respectively. The actuator 150 is configured to rotate in response to the rotation of the motor 140 and cause the common contact 162 to break an existing connection with one of the switch contacts 164A-D and establish a new connection with another of the switch contacts via mechanical or electromagnetic linkage. The motor 140 can be any type of an electrically controllable motor including, but are not limited to, a stepper motor and a server motor having a rotational position feedback. By providing an appropriate rotation signal (e.g., step pulses in case of a stepper motor), the motor 140 can be made to rotate by a predetermined angle. For example, in case of a SP4T switch, each stepper pulse rotates the upper and lower rotor 142, 144 by 90°. In that case, in order to move from Position 1 (FIG. 2) to Position 3 (FIG. 2), the rotation pulse includes two stepper pulses, each effectuating a 90° rotation.

Figure 3:
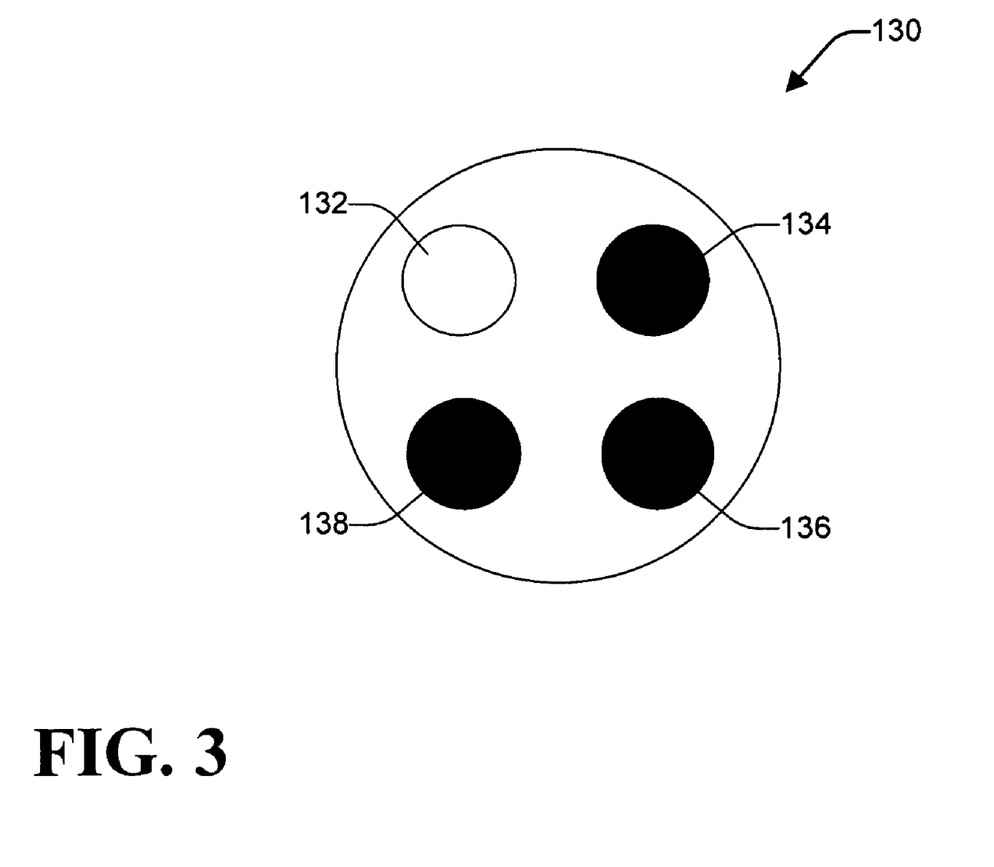
FIG. 3 is a bottom-up view of a target disk comprising a light reflective portion such as the one shown in FIG. 1 according to a certain aspect of the present disclosure.

FIG. 3 is a bottom-up (e.g., +z direction) view of the target disk 130 shown in FIG. 1. The target disk 130 includes a reflective portion or reflector 132, a first non-reflective portion 134, a second non-reflective portion 136, and a third non-reflective portion 138. The reflective portion or reflector 132 reflects a substantial (e.g., >50%) of incident light and may be formed from a patterned deposition of a metal film such as Al or Au film onto an opaque disk. In some embodiments, the non-reflective portions 134, 136, and 138 that comprise materials that substantially absorb or scatter incident light may be separately deposited onto the opaque disk. In other embodiments, the opaque disk itself serves as the non-reflective portions without additional depositions.

Figure 4:
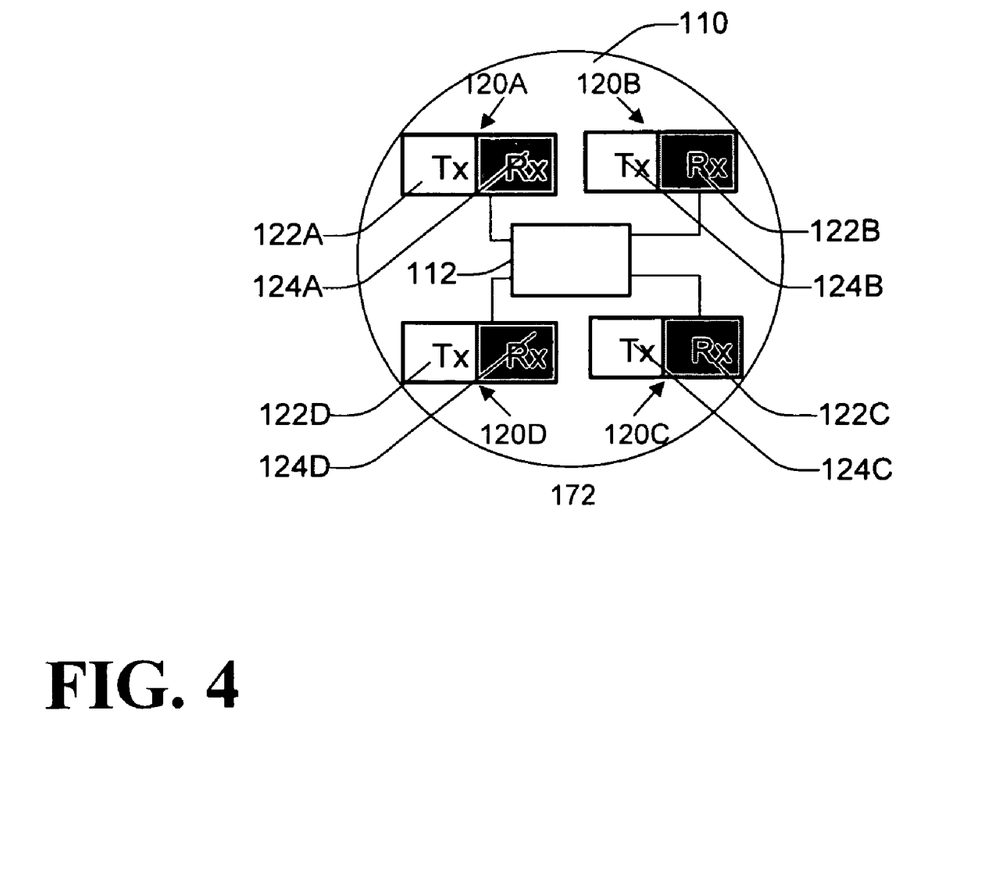
FIG. 4 is a diagram of a printed circuit board comprising optical transmitters and sensors according to a certain aspect of the present disclosure.

The target disk 130 is likewise coupled to the motor 140 and configured to rotate in response to the rotation of the motor 140. The resulting rotation of the target disk 130 cause the reflective and non-reflective portions 132-138 to rotate with respect to the PCB 110 having optical sensors 120A, 120B, 120C, and 120D as shown in FIG. 4. In the illustrated example, each of the optical sensors 120A-D comprises a pair of a light transmitter 122A-D and a light detector 124A-D. The light transmitter 122A-D may be any light source such as a diode laser or an LED. The light detector 124A-D may be any device that is capable of detecting light such as a photodiode, a phototransistor, or a photoresistor. In certain embodiments, each of the light transmitters (e.g., 122A) is integrated in the same package as each of the corresponding light detector (e.g., 124A), and the integrated package is installed (e.g., soldered) on the PCB 110. In other embodiments, the light transmitters 122A-D and the light detectors are individual components separately installed on the PCB 110. The PCB 110 and the target disk 130 are positioned in close proximity to prevent a light spillover to adjacent sensors, e.g., to reduce or eliminate a portion of light transmitted from a light transmitter (e.g., 122A) and reflected from a reflective portion (e.g., 132) from reaching a light detector (e.g., 124B) that is not associated with the light transmitter. To further prevent such a light spillover, the optical sensor (e.g., 120A) may have a side wall 129A as shown in FIG. 1 to limit the angular distribution of the transmitted light.

Figure 6:
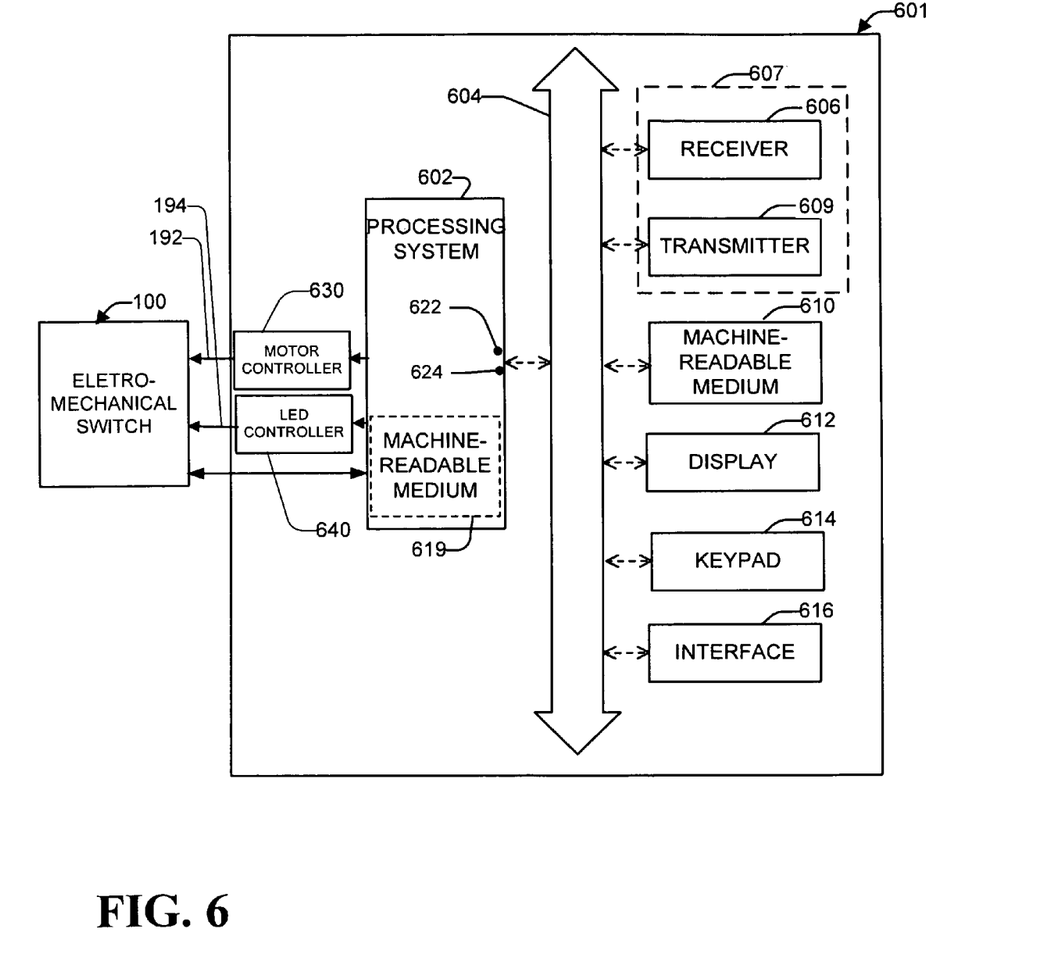
FIG. 6 is a conceptual block diagram illustrating an example of a system in which some aspects of the subject technology can be implemented.

In certain embodiments, the PCB 110 includes detector circuits 112 having inputs connected to and configured to receive a signal (e.g., a pulse) from one of the light detectors 124A-D indicative of reception of light reflected from the reflective portion 132 and to provide a latched output upon receiving such a signal. Outputs of the detector circuits 112 may be polled by the control system 601 (FIG. 6) at a later time. In some embodiments, the latchable detector circuits 112 are formed in a single integrated package. In other embodiments, the detector circuits 112 are part of the light detectors. In yet other embodiments, the detector circuits 112 are part of the control system 601 (FIG. 6).

Figure 5:
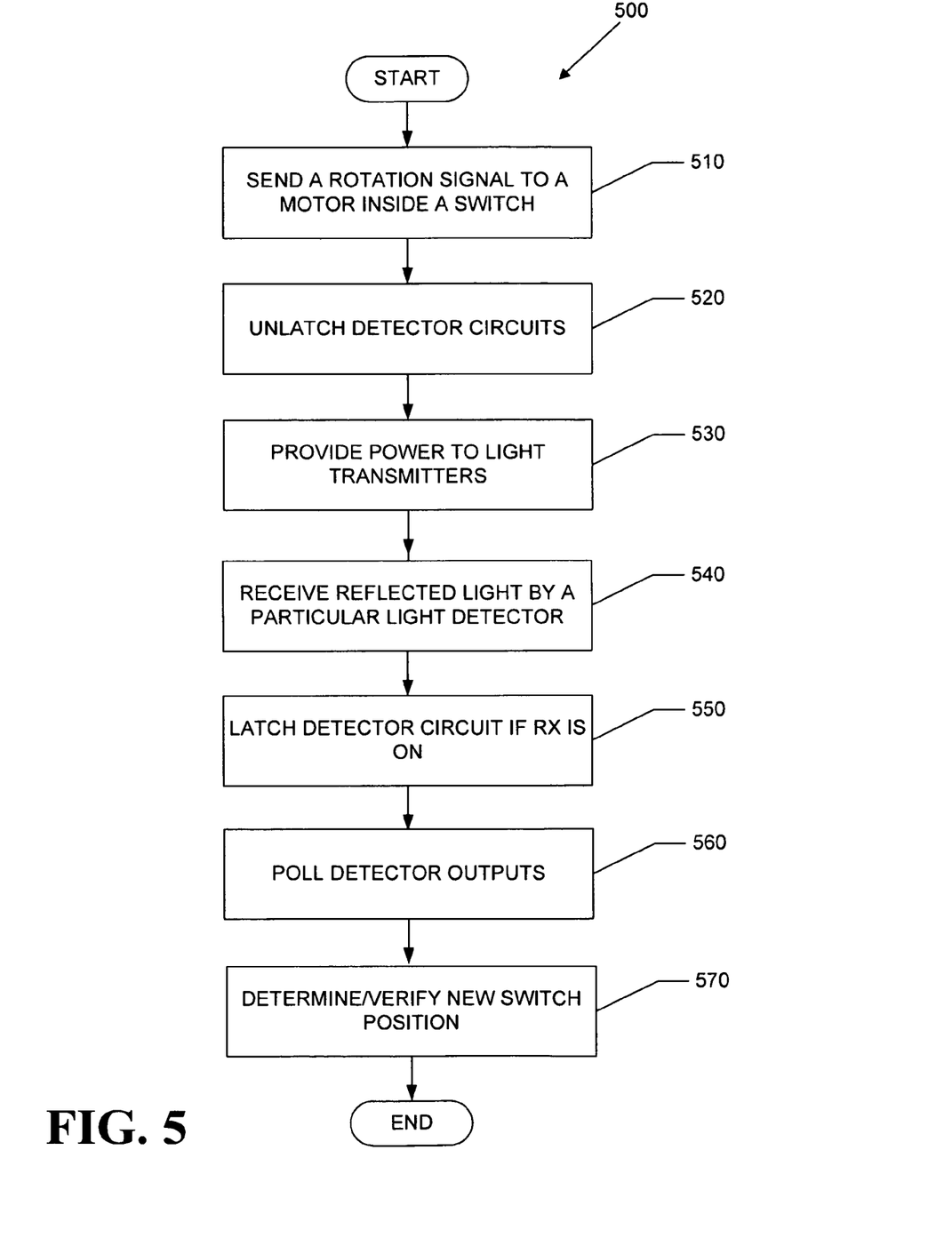
FIG. 5 us a flowchart illustrating an exemplary process of operation of an electro-mechanical switch according to a certain aspect of the present disclosure.

Operation of the electromechanical switch 100 is now described with reference to a flowchart in FIG. 5 illustrating an exemplary process 500 of operation of a telemetry system including an electromechanical switch such as the electromechanical switch 100 and also with FIG. 6 which is a block diagram of an exemplary control system 601 that controls the operation of the electromechanical switch 100. For the purpose of illustration only, it is now assumed that initially (prior to the operation 510), the electromechanical switch 100 is in Position 2 (FIG. 2) in which the common contact 162 is connected to the switch contact 164B, and the reflective potion 132 is positioned directly over the optical sensor 120B. It is also assumed that that the control system 601 desires the electromechanical switch 100 to move to Position 1 in which the common contact 162 is connected to the switch contact 164A, and the reflective portion 132 is positioned directly over the optical sensor 120A as shown in FIG. 1.

The process 500 begins at start state and proceeds to an operation 510, in which a rotation signal 192 is sent from the control system 601 to the motor 140. As described above, the motor 140 may be a stepper motor, and the rotation signal 192 may comprise one or more stepper pulses configured to rotate the upper and lower rotors 144, 142 and hence the actuator 150 and the target disk 130 coupled to the upper and lower rotors 144, 142 by a predetermined rotation angle. In this case, the control system 601 can rotate the motor 140 either +270° by sending a rotation signal comprising three stepper pulses or −90° by sending an alternative rotation signal comprising one reverse stepper pulse. In either case, the electromechanical switch 100 moves to Position 1 as shown in FIG. 1.

The process 500 proceeds to an operation 520, in which detector circuits 112 associated with the light detectors 124A-D (FIG. 4) are unlatched. As described above with respect to FIG. 4, the detector circuits 112 include inputs connected to and configured to receive a signal (e.g., a pulse) from one of the light detectors 124A-D indicative of reception of light reflected from the reflective portion 132 and to provide a latched output upon receiving such a signal. The unlatching at the state 520 clears any latched outputs from previous switching event so that a new latched output can be provided upon receiving a signal from one of the light detectors 124A-D.

The process 500 proceeds to an operation 530, in which power is provided to light transmitters/sources 122A-D. For example, the light transmitters (e.g., LEDs) can receive electrical currents from the control system 601 via the control cable 190. Alternatively, the PCB 110 may include a switch that is configured to receive a switch control signal from the control system 601 via the control cable 190 and to provide power to the LEDs via the switch. Upon receiving the power, the light transmitters 122A-D transmit light toward the target disk 130 as shown in FIG. 1. Also as shown in FIG. 1, a light beam 123A transmitted by the light transmitter 122A is reflected by the reflective portion 132 of the target 130 to form a reflected light beam 125A, while a light beam 123B transmitted by the light transmitter 122B is absorbed or scattered by the non-reflective portion 134 of the target disk 130.

The process 500 proceeds to an operation 540, in which light reflected from the reflective portion 132 (e.g., the reflected light beam 125A) is received by the light detector 124A; and then to an operation 550, in which the detector circuit associated with the light detector 124A that has received the reflected light is latched. After the latching, the power provided to the light transmitters 122A-D may be turned off to conserve power and reduced heating. The process 500 proceeds to an operation 570, in which the control system 601 polls the outputs of the detector circuits 112 (FIG. 4) to determine which of the light detectors 124A-D has received light reflected from the reflective portion 132 of the target disk 130. This polling operation may happen several times before another activation takes place. The process 500 then proceeds to an operation 580, in which the new switch position (Position 1 in this case) is determined or verified based on the polled information.

It shall be appreciated by those skilled in the art in view of the present disclosure that the hardware and process arrangements discussed above are provided for the purpose of illustration only, and other arrangements may be employed without departing from the scope of the present disclosure. For example, in certain embodiments, there may not be detector circuits interposed between the light detectors 124A-D and the control system 601. Instead, the control system 601 may be configured to monitor the outputs of the light detectors 122A-D directly after providing power to the light transmitters 122A-D. For example, the outputs of the light detectors 124A-D, instead of being connected to any detector circuits, may be connected to interrupt inputs of a processor in a processing system 602 of the control system 601 (FIG. 6). An application program running in the processing system may detect a signal received at one of the interrupt inputs. In such an embodiment, the steps 550 and 560 of FIG. 5 may not be present.

As another example of alternative arrangements, instead of providing separate light transmitters 122A-D as shown in FIG. 4, there may be only one light transmitter positioned at the center of the PCB 110 that is configured to transmit, a light beam having a wide beam pattern toward the target disk 130. Only a portion of the wide light beam reflected from the reflective portion 132 is received by one of the light detectors 124A-D. As yet another example of alternative arrangements, the target disk 130 may have one non-reflective portion and a plurality of reflective portions, and the non-reflective potion may be positioned above the optical sensor associated with the new contact position. In such an embodiment, the new switch position is determined or verified by identifying a light detector that did not receive reflected light.

As discussed briefly above, FIG. 6 is a block diagram of an exemplary control system 601 that controls the operation of the electromechanical switch 100. The control system 601, which may be, for example, a desktop computer, a laptop computer or another type of computing device, includes a processing system 602. The processing system 602 is capable of communication with a receiver 606 and a transmitter 609 through a bus 604 or other structures or devices. It should be understood that communication means other than busses can be utilized with the disclosed configurations. The processing system 602 can generate audio, video, multimedia, and/or other types of data to be provided to the transmitter 609 for communication. In addition, audio, video, multimedia, and/or other types of data can be received at the receiver 606, and processed by the processing system 602.

The processing system 602 may include a general-purpose processor or a specific-purpose processor for executing instructions and may further include a machine-readable medium 619, such as a volatile or non-volatile memory, for storing data and/or instructions for software programs. The instructions, which may be stored in a machine-readable medium 610 and/or 619, may be executed by the processing system 602 to control and manage access to the various networks, as well as provide other communication and processing functions. The instructions may also include instructions executed by the processing system 602 for various user interface devices, such as a display 612 and a keypad 614. The processing system 602 may include an input port 622 and an output port 624. Each of the input port 622 and the output port 624 may include one or more ports. The input port 622 and the output port 624 may be the same port (e.g., a bi-directional port) or may be different ports.

The processing system 602 may be implemented using software, hardware, or a combination of both. By way of example, the processing system 602 may be implemented with one or more processors. A processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable device that can perform calculations or other manipulations of information.

A machine-readable medium can be one or more machine-readable media. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media (e.g., 619) may include storage integrated into a processing system, such as might be the case with an ASIC. Machine-readable media (e.g., 610) may also include storage external to a processing system, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device. In addition, machine-readable media may include a transmission line or a carrier wave that encodes a data signal. Those skilled in the art will recognize how best to implement the described functionality for the processing system 602. According to one aspect of the disclosure, a machine-readable medium is a computer-readable medium encoded or stored with instructions and is a computing element, which defines structural and functional interrelationships between the instructions and the rest of the system, which permit the instructions' functionality to be realized. Instructions can be, for example, a computer program including code.

An interface 616 may be any type of interface and may reside between any of the components shown in FIG. 6. An interface 616 may also be, for example, an interface to the outside world (e.g., an Internet network interface). A functionality implemented in a processing system 602 may be implemented in a portion of a receiver 606, a portion of a transmitter 609, a portion of a machine-readable medium 610, a portion of a display 612, a portion of a keypad 614, or a portion of an interface 616, and vice versa. A transceiver block 607 may represent, for example, a wired or wireless computer interface between the system 601 and the measurement device 690.

Various aspects of the subject technology can be implemented in the system 601 with respect to various components of the electromechanical switch 100. For example, the processing system 602 can determine a degree of rotation to arrive at a new switch position and generate or cause a motor controller 630 to generate a rotation signal 192 configured to rotate the motor 140 inside the electromechanical switch 100 by the determined degree of rotation. The processing system 602 can also provide or cause a LED controller 640 to provide power 194 to the light transmitters 122A-D inside the electromechanical switch 100. The processing system 602 can also poll the outputs of detector circuits inside or outside the electromechanical switch 100 to determine which of the light detectors 124A-D has received reflected light and also from that information determine or verify the new position of the electromechanical switch 100. A verification record indicating whether the new position for the electromechanical switch 100 has been achieved after each rotation and verification process such as the process 500 can be kept in the machine-readable medium 619, 610. A series of switch positions to be applied to the electro-mechanical switch 100 may also be stored in the machine-readable medium 619, 610.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An electromechanical switch comprising:
    a switching member having a common contact and a plurality of switch contacts, the common contact configured to be connected to one of the plurality of switch contacts in a given switch position;
    a motor coupled to the switching member and configured to rotate by a predetermined angle in response to a rotation signal;
    a target disk coupled to the motor and configured to be rotated by the predetermined angle, a surface of the target disk having a light reflective portion;
    at least one light transmitter disposed relative to the target disk and configured to transmit light toward the surface of the target disk having the light reflective portion; and
    a plurality of light detectors disposed relative to the at least one light transmitter, each of the plurality of light detectors associated with a corresponding one of the plurality of switch contacts, at least one of the plurality of light detectors configured to receive light reflected from the light reflective portion of the target disk for a given switch position.

2. The electromechanical switch of claim 1 further comprising a printed circuit board comprising the at least one light transmitter and the plurality of light detectors.

3. The electromechanical switch of claim 1, further comprising a plurality of light transmitters, the plurality of light transmitters including the at least one light transmitter, each of the plurality of light transmitters associated with a corresponding one of the plurality of light detectors.

4. The electromechanical switch of claim 3, wherein each of the plurality of light detectors and a corresponding one of the plurality of light transmitters is integrated into a sensor package.

5. The electromechanical switch of claim 4, wherein the integrated sensor package includes a side wall formed on a periphery of the sensor package to prevent a spillover of light into surrounding sensor packages.

6. The electromechanical switch of claim 1, wherein at a given switch position, the light reflective portion is positioned above the at least one of the plurality of light detectors.

7. The electromechanical switch of claim 1 further comprising a detector circuit that is configured to receive, from the at least one of the plurality of light detectors, a signal indicative of the light reflected from the light reflective portion and to provide a latched output.

8. The electromechanical switch of claim 1, wherein for a second switch position, a second one of the plurality of light detectors is configured to receive light reflected from the light reflective portion of the target disk.

9. A method of verifying a new contact position of a multi-pole electromechanical switch having a plurality of contact positions, the method comprising:
    causing the switch to move to a new contact position;
    providing power to at least one light transmitter to cause the at least one light transmitter to transmit light toward a light reflector;
    identifying a particular light detector among a plurality of light detectors that has received light reflected from the light reflector; and
    verifying the new contact position based on the identification.

10. The method of claim 9, wherein the causing the switch to move to the new contact position comprises providing a rotation signal to a motor disposed inside the switch.

11. The method of claim 9, wherein each of the plurality of light detectors is associated with a corresponding one of the plurality of contact positions.

12. The method of claim 9, further comprising unlatching outputs of a plurality of detector circuits coupled to the plurality of light detectors prior to providing the power to the at least one light transmitter.

13. The method of claim 12, further comprising latching a signal from the particular light detector.

14. The method of claim 13, further comprising turning off the power provided to the at least one light transmitter after latching the signal.

15. A telemetry system comprising:
    an electromechanical switch comprising:
        a switching member having a plurality of contact positions,
        a motor coupled to the switching member;
        a target disk coupled to the motor and having a light reflective portion;
        at least one light transmitter disposed relative to the target disk and configured to transmit light toward the target disk, and
        a plurality of light detectors disposed relative to the light detector, at least one of the plurality of light detectors configured to receive light reflected from the light reflective portion for a given switch position; and
    a control system configured to be electrically coupled to the electromechanical switch and configured to:
        send a rotation signal to the motor to cause the switching member to move to a new contact position,
        provide power to the at least one light transmitter to cause the at least one light transmitter to transmit light toward a light reflective portion,
        identify a particular light detector among the plurality of light detectors that has received light reflected from the light reflective portion, and
        verify the new contact position based on the identification.

16. The telemetry system of claim 15, wherein the electromechanical switch comprises a plurality of light transmitters, each of the plurality of light transmitters associated with a corresponding one of the plurality of light detectors.

17. The telemetry system of claim 15, further comprising a plurality of detector circuits that are connected to the plurality of light detectors and configured to provide a latched output if a signal indicative of the light reflected from the light reflective portion is received from one of the plurality of light detectors.

18. The telemetry system of claim 17, wherein the control system is further configured to poll outputs of the plurality of detector circuits for the latched output.

19. The telemetry system of claim 15, wherein the control system comprises a motor controller.

* * * * *